United States Patent

Hamatani

(10) Patent No.: US 8,644,045 B2
(45) Date of Patent: Feb. 4, 2014

(54) TEMPERATURE CONTROLLED VOLTAGE CONVERSION DEVICE

(75) Inventor: Takashi Hamatani, Nishikamo-gun (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 390 days.

(21) Appl. No.: 12/670,602

(22) PCT Filed: Jul. 18, 2008

(86) PCT No.: PCT/JP2008/063473
§ 371 (c)(1),
(2), (4) Date: Jan. 25, 2010

(87) PCT Pub. No.: WO2009/014236
PCT Pub. Date: Jan. 29, 2009

(65) Prior Publication Data
US 2010/0207598 A1    Aug. 19, 2010

(30) Foreign Application Priority Data

Jul. 26, 2007    (JP) ................................. 2007-194754

(51) Int. Cl.
*H05K 7/20*    (2006.01)
*H02M 3/156*    (2006.01)

(52) U.S. Cl.
USPC .......................................... 363/141; 323/351

(58) Field of Classification Search
USPC ................... 323/351, 907; 363/141
See application file for complete search history.

(56) References Cited

U.S. PATENT DOCUMENTS

| | | | |
|---|---|---|---|
| 2003/0057914 A1* | 3/2003 | Kamatsu et al. | 318/727 |
| 2003/0141854 A1* | 7/2003 | Kuribayashi et al. | 322/28 |
| 2003/0183430 A1* | 10/2003 | Naito et al. | 180/65.2 |
| 2004/0194497 A1* | 10/2004 | Sasaki et al. | 62/505 |
| 2005/0151503 A1 | 7/2005 | Yaeshima et al. | |
| 2005/0204761 A1* | 9/2005 | Karikomi et al. | 62/228.1 |
| 2006/0096299 A1* | 5/2006 | Mamitsu et al. | 62/3.2 |
| 2007/0052382 A1* | 3/2007 | Nomura et al. | 318/439 |
| 2007/0278986 A1* | 12/2007 | Okamura | 318/798 |
| 2009/0108794 A1* | 4/2009 | Ochiai et al. | 318/760 |

FOREIGN PATENT DOCUMENTS

| | | |
|---|---|---|
| CN | 1641989 A | 7/2005 |
| EP | 1 665 514 | 6/2006 |
| JP | 11-069836 A | 3/1999 |
| JP | 2960469 A | 10/1999 |
| JP | 2000-350448 A | 12/2000 |
| JP | 2001-008441 A | 1/2001 |

(Continued)

OTHER PUBLICATIONS

Korean Office Action for corresponding KR Patent Application No. 10-2010-7004049 issued on Sep. 19, 2011.

(Continued)

*Primary Examiner* — Adolf Berhane
*Assistant Examiner* — Emily P Pham
(74) *Attorney, Agent, or Firm* — Sughrue Mion, PLLC

(57) ABSTRACT

A switching frequency setting unit sets switching frequency of a switching element, based on both the temperature of a cooling medium which cools a DC-DC converter and the temperature of a switching element of the DC-DC converter. A switching controller controls the voltage conversion ratio of the DC-DC converter by controlling switching operation of the switching element at the set switching frequency.

9 Claims, 9 Drawing Sheets

(56) References Cited

FOREIGN PATENT DOCUMENTS

| | | |
|---|---|---|
| JP | 2004-096827 A | 3/2004 |
| JP | 2004-135465 A | 4/2004 |
| JP | 2004-201463 A | 7/2004 |
| JP | 2005-073392 A | 3/2005 |
| WO | 02/065628 A1 | 8/2002 |
| WO | 2006/006288 A1 | 1/2006 |
| WO | 2006/101188 A1 | 9/2006 |

OTHER PUBLICATIONS

Japanese Office Action dated Oct. 21, 2008.
Chinese Office Action issued in corresponding Chinese Application No. 200880025481.4 dated Jun. 26, 2012.
Extended European Search Report issued in corresponding European Application No. 08791710.0 dated Aug. 28, 2012.

* cited by examiner

TEMPERATURE CONTROLLED VOLTAGE CONVERSION DEVICE

TECHNICAL FIELD

The present invention relates to a voltage conversion device which converts direct current power from a direct current power supply into direct current power of a different voltage value utilizing a switching operation of a switching element, and outputs the converted power.

BACKGROUND ART

JP 2001-8441 A discloses related art of a voltage conversion device of this type. A voltage conversion device of Patent Document 1 is a DC-DC converter which converts direct current power from a secondary battery (direct current power supply) to direct current power of a different voltage value utilizing a switching operation of a transistor and outputs the converted power, and the cycle of the pulse applied to the transistor is changed based on a temperature around the DC-DC converter.

In a DC-DC converter, in some cases, a capacitor (filtering capacitor) is provided at the input side in parallel with the direct current power supply (secondary battery). During a switching operation of the transistor of the DC-DC converter, a ripple component is generated in current flowing in a reactor. When the filtering capacitor is provided in parallel with the direct current power supply, the current flowing through the reactor becomes a current in which the current of the filtering capacitor (ripple component) is superposed on a current of the direct current power supply (direct current component). With such a configuration, variation in current of the direct current power supply can be suppressed.

In addition, in such a DC-DC converter, heat is generated in the switching element during the switching operation of the switching element, and the amount of generated heat in the switching element is increased as the switching frequency is increased. In order to prevent overheating of the switching element (transistor), the switching frequency (carrier frequency) of the switching element is changed. For example, when the temperature of the switching element is higher than a predetermined temperature, the switching frequency of the switching element is reduced so that temperature increase of the switching element is suppressed.

However, when the switching frequency of the switching element is reduced, although the temperature increase of the switching element is suppressed, the ripple component of the current flowing through a reactor is increased, and consequently the extent of temperature increase due to the ripple current of the reactor is increased, resulting in a higher tendency to overheat. Furthermore, when the filtering capacitor is provided in parallel with the direct current power supply, if the switching frequency of the switching element is reduced, the ripple current flowing through the filtering capacitor is also increased, and consequently the extent of temperature increase due to the ripple current of the filtering capacitor is increased, resulting in a higher tendency to overheat. As described, in a DC-DC converter, the temperature increase characteristic of the switching element and the temperature increase characteristic of a reactor and a filtering capacitor have opposite characteristics with respect to change of the switching frequency. Because of this, although the overheating of the switching element can be suppressed by changing the switching frequency of the switching element according to the temperature of the switching element, it is not possible to prevent the overheating of the filtering capacitor or the reactor.

DISCLOSURE OF INVENTION

An advantage of the present invention is that a voltage conversion device is provided in which at least one of overheating of a capacitor provided at the input side of the DC-DC converter in parallel with a direct current power supply and overheating of a reactor of the DC-DC converter can be prevented.

According to one aspect of the present invention, there is provided a voltage conversion device having a DC-DC converter which comprises a reactor which can temporarily accumulate energy due to direct current from a direct current power supply, and a switching element which converts, using the energy accumulated in the reactor, direct current power from the direct current power supply to direct current power of a different voltage value by utilizing a switching operation of the switching element, and outputs the converted power, a capacitor which is provided at an input side of the DC-DC converter and in parallel with the direct current power supply, and a cooling unit which cools the DC-DC converter with a cooling medium, the voltage conversion device comprising a cooling medium temperature detecting unit which detects a temperature of the cooling medium, a switching frequency setting unit which sets a switching frequency of the switching element based on both the temperature of the cooling medium and a temperature of the switching element, and a switching controller which controls the switching operation of the switching element using the set switching frequency, to control a voltage conversion ratio of the DC-DC converter.

According to another aspect of the present invention, it is preferable that, in the voltage conversion device, the switching frequency setting unit sets the switching frequency of the switching element to a first frequency or a second frequency which is lower than the first frequency, based on the temperature of the switching element, and, when the temperature of the cooling medium detected by the cooling medium temperature detecting unit is higher than a set temperature T1, the switching frequency setting units sets the switching frequency of the switching element to the first frequency regardless of the temperature of the switching element.

According to another aspect of the present invention, it is preferable that, in the voltage conversion device, when the temperature of the cooling medium detected by the cooling medium temperature detecting unit is higher than a set temperature T2 (wherein T2>T1), the switching controller controls the switching operation of the switching element to reduce the voltage conversion ratio of the DC-DC converter compared to that when the temperature of the cooling medium is lower than or equal to the set temperature T2. In this aspect of the present invention, it is also preferable that, when the temperature of the cooling medium detected by the cooling medium temperature detecting unit is higher than a set temperature T3 (wherein T3>T2), the switching controller prohibits the switching operation of the switching element.

According to another aspect of the present invention, it is preferable that, in the voltage conversion device, when the temperature of the cooling medium detected by the cooling medium temperature detecting unit is higher than a set temperature T3 (wherein T3>T1), the switching controller prohibits the switching operation of the switching element.

According to another aspect of the present invention, it is preferable that, in the voltage conversion device, a switching frequency setting characteristic determined based on the temperature of the switching element and a switching frequency setting characteristic determined based on the temperature of the cooling medium are different characteristics.

According to another aspect of the present invention, there is provided a voltage conversion device having a DC-DC converter which comprises a reactor which can temporarily accumulate energy using a direct current from a direct current power supply, and a switching element and which converts, using the energy accumulated in the reactor, direct current power from the direct current power supply to direct current power of a different voltage value by utilizing a switching operation of the switching element and outputs the converted power, a capacitor which is provided at an input side of the DC-DC converter and in parallel to the direct current power supply, and a cooling unit which cools the DC-DC converter with a cooling medium, the voltage conversion device comprising a switching frequency setting unit which sets a switching frequency of the switching element to a first frequency or a second frequency which is lower than the first frequency, based on a temperature of the switching element, a switching controller which controls the switching operation of the switching element by the set switching frequency, to control a voltage conversion ratio of the DC-DC converter, and a cooling medium temperature detecting unit which detects a temperature of the cooling medium, wherein, when the temperature of the cooling medium detected by the cooling medium temperature detecting unit is higher than a set temperature T2, the switching controller controls the switching operation of the switching element to reduce the voltage conversion ratio of the DC-DC converter compared to that when the temperature of the cooling medium is lower than or equal to the set temperature T2.

According to another aspect of the present invention, there is provided a voltage conversion device having a DC-DC converter which comprises a reactor which can temporarily accumulate energy as a result of direct current from a direct current power supply, and a switching element and which converts, using the energy accumulated in the reactor, direct current power from the direct current power supply to a direct current power of a different voltage value utilizing a switching operation of the switching element and outputs the converted power, a capacitor which is provided at an input side of the DC-DC converter and in parallel with the direct current power supply, and a cooling unit which cools the DC-DC converter with a cooling medium, the voltage conversion device comprising a switching frequency setting unit which sets a switching frequency of the switching element to a first frequency or a second frequency which is lower than the first frequency, based on a temperature of the switching element, a switching controller which controls the switching operation of the switching element by the set switching frequency, to control a voltage conversion ratio of the DC-DC converter, and a cooling medium temperature detecting unit which detects a temperature of the cooling medium, wherein, when the temperature of the cooling medium detected by the cooling medium temperature detecting unit is higher than a set temperature T3, the switching controller prohibits the switching operation of the switching element.

According to another aspect of the present invention, it is preferable that, in the voltage conversion device, the cooling unit cools at least one of the reactor and the capacitor with the cooling medium.

According to various aspects of the present invention, it is possible to prevent at least one of overheating of the capacitor which is provided at the input side of the DC-DC converter and in a parallel with the direct current power supply and overheating of the reactor of the DC-DC converter.

BEST MODE FOR CARRYING OUT THE INVENTION

A preferred embodiment of the present invention will now be described in detail with reference to the drawings.

Figure 1:
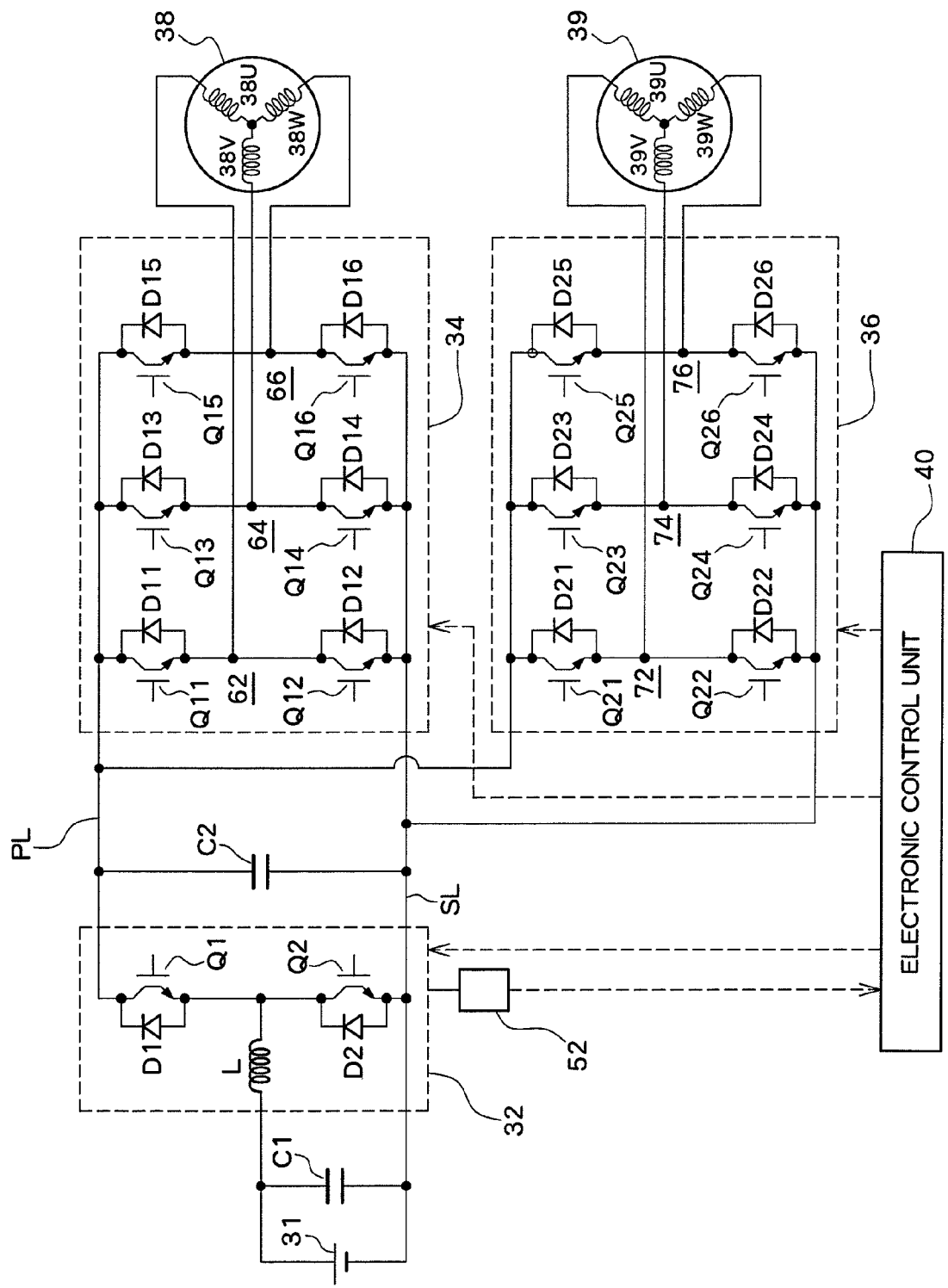
FIG. 1 is a diagram schematically showing a structure of a motor driving system having a voltage conversion device according to a preferred embodiment of the present invention.

FIG. 1 is a diagram schematically showing a structure of a motor driving system having a voltage conversion device according to a preferred embodiment of the present invention. A motor driving system related to the present embodiment may be used as, for example, a driving system of a vehicle, and, as shown in FIG. 1, comprises a secondary battery 31 which is a direct current power supply which can be charged and discharged, a DC-DC converter 32 which converts direct current power from the secondary battery 31 to direct current power of a different voltage value and outputs the converted power, a filtering capacitor C1 which is provided at an input side of the DC-DC converter 32, inverters 34 and 36 which convert the direct current power from the DC-DC converter 32 to an alternating current and output the converted power, an averaging capacitor C2 provided at input sides of the inverters 34 and 36 (output side of DC-DC converter 32), motor generators 38 and 39 which receive the alternating current power from the inverters 34 and 36 and which can be rotationally driven, and an electronic control unit 40 which controls the overall device.

The DC-DC converter 32 comprises two power transistors (switching elements) Q1 and Q2 which are connected in series such that the source side and the sink side are at a positive side line PL and a negative side line SL of the inverters 32 and 36, two diodes D1 and D2 which are connected in an inverse-parallel connection to the power transistors Q1 and Q2, and a reactor L having one terminal connected to one terminal of the secondary battery 31 (positive side terminal) and the other terminal connected to a connection point of the power transistors Q1 and Q2. The power transistor Q1 is placed between the other terminal of the reactor L and an output terminal of the DC-DC converter 32 (positive side line PL of the inverters 34 and 36), and the power transistor Q2 is placed between the other terminal of the reactor L and the other terminal (negative side terminal) of the secondary battery 31. In the DC-DC converter 32, when the power transistor Q2 is switched ON, a short-circuited circuit connecting the secondary battery 31, the reactor L, and the power transistor Q2 is formed, and energy is temporarily accumulated in the reactor L as a result of direct current flowing from the secondary battery 31. When the power transistor Q2 is switched from ON to OFF in this state, the energy accumulated in the reactor L is accumulated in the averaging capacitor C2 through the diode D1. During this process, the direct current voltage of the averaging capacitor C2 (output voltage of the DC-DC converter 32) can be set higher than the direct current voltage of the secondary battery 31 (input voltage of the DC-DC converter 32). Therefore, the DC-DC converter 32 can function, with the switching operation for driving the power transistors Q1 and Q2 ON and OFF, as a voltage boosting converter which converts (boosts) the input direct current power from the secondary battery 31 to a direct current power of a different voltage value and outputs to the inverters 34 and 36. On the other hand, with the DC-DC converter 32, the secondary battery 31 can be charged using the charge in the averaging capacitor C2. In this case, the DC-DC converter 32 functions as a voltage reducing converter.

On the input side of the DC-DC converter 32, the filtering capacitor C1 is provided in parallel with the secondary battery 31. More specifically, one terminal of the filtering capacitor C1 is connected to the positive side terminal of the secondary battery 31 and the one terminal of the reactor L, and the other terminal of the filtering capacitor C1 is connected to the negative side terminal of the secondary battery 31. During the switching operation of the power transistors Q1 and Q2, a ripple component is generated in the current flowing through the reactor L. When the filtering capacitor C1 is provided in parallel with the secondary battery 31, the current flowing through the reactor L becomes a current in which the current of the filtering capacitor C1 (ripple component) is superposed on the current of the secondary battery 31 (direct current component), and thus the current change of the secondary battery 31 can be suppressed.

The inverter 34 comprises a plurality (three in FIG. 1) of arms 62, 64, and 66 which are connected in parallel with each other between the positive side line PL and the negative side line SL. The arm 62 comprises a pair of power transistors (switching elements) Q11 and Q12 which are connected in series between the positive side line PL and the negative side line SL and a pair of diodes D11 and D12 which are connected in an inverse-parallel connection to the power transistors Q11 and Q12, respectively. Similarly, the arm 64 comprises a pair of power transistors Q13 and Q14 connected in series between the positive side line PL and the negative side line SL, and a pair of diodes D13 and D14 which are connected in an inverse-parallel connection to the power transistors Q13 and Q14, respectively, and the arm 66 comprises a pair of power transistors Q15 and Q16 which are connected in series between the positive side line PL and the negative side line SL, and a pair of diodes D15 and D16 which are connected in an inverse-parallel connection to the power transistors Q15 and Q16, respectively. Coils (three-phase coils) 38U, 38V, and 38W of the motor generator 38 are connected in a Y connection (star connection), and are connected to the intermediate points of the arms 62, 64, and 66, respectively. The inverter 34 converts, with the switching operation of the power transistors Q11~Q16, the input direct current power from the DC-DC converter 32 to a three-phase alternate current having phase differing by 120°, and supplies the converted power to the three-phase coils 38U, 38V, and 38W of the motor generator 38. With this process, the motor generator 38 can be rotationally driven. On the other hand, it is also possible to convert, with the inverter 34, the alternate current power of the three-phase coils 38U, 38V, and 38W of the motor generator 38 into direct current, and to supply the converted power to the DC-DC converter 32.

The inverter 36 has a structure similar to the inverter 34, and comprises an arm 72 having power transistors Q21 and Q22 and diodes D21 and D22, an arm 74 having power transistors Q23 and Q24 and diodes D23 and D24, and an arm 76 having power transistors Q25 and Q26 and diodes D25 and D26. Three-phase coils 39U, 39V, and 39W of the motor generator 39 which are connected in a Y connection (star connection) are connected to the intermediate points of the arms 72, 74, and 76, respectively. The inverter 36 converts, with the switching operation of the power transistors Q21~Q26, the input direct current power from the DC-DC converter 32 to three-phase alternate current having phase differing by 120° and supplies the converted power to the three-phase coils 39U, 39V, and 39W of the motor generator 39, so that the motor generator 39 can be rotationally driven. On the other hand, it is also possible to convert, with the inverter 36, the alternate current power of the three-phase coils 39U, 39V, and 39W of the motor generator 39 to direct current, and to supply the converted power to the DC-DC converter 32.

Figure 2:
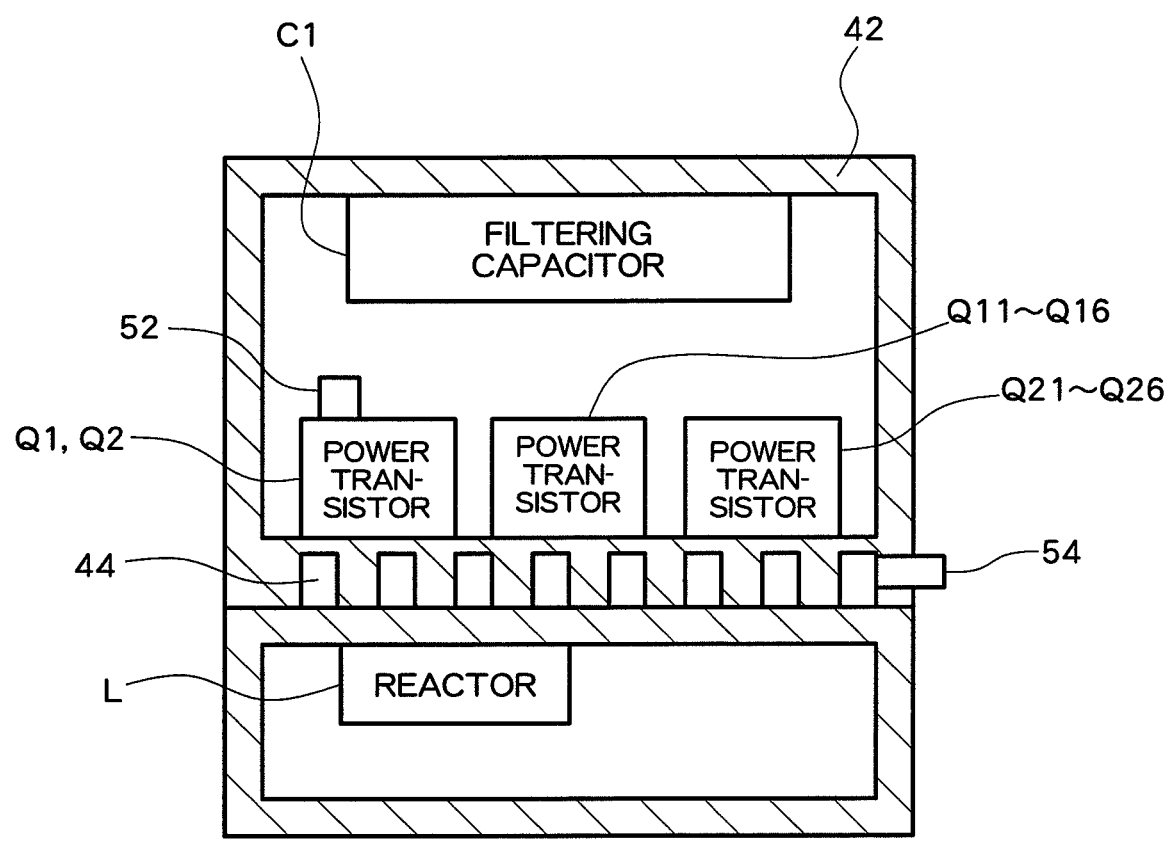
FIG. 2 is a diagram schematically showing a structure of a motor driving system having a voltage conversion device according to a preferred embodiment of the present invention.

As shown in FIG. 2, the filtering capacitor C1, the DC-DC converter 32 (reactor L and power transistors Q1 and Q2), the inverter 34 (power transistors Q11~Q16), and the inverter 36 (power transistors Q21~Q26) are stored in a housing 42. In FIG. 2, however, for convenience of the explanation, the electric lines are not shown. The housing 42 in this configuration is formed with a conductive material such as a metal (for example, aluminum) so that the housing 42 also functions to shield, from the outside, the electronic components which are stored inside. A coolant channel 44 in which a cooling medium such as a cooling liquid (cooling water) flows is formed as a cooling unit in the housing 42. With the cooling liquid flowing in the coolant channel 44, the DC-DC converter 32 (the rector L and power transistors Q1 and Q2) stored in the housing 42 can be cooled. In addition, with the cooling liquid flowing in the coolant channel 44, the filtering capacitor C1, the inverter 34 (power transistors Q11~Q16), and the inverter 36 (power transistors Q21~Q26) which are stored in the housing 42 can also be cooled.

A temperature sensor 52 is provided on, for example, a chip on which the power transistors Q1 and Q2 are formed, and detects a temperature Tt of the power transistors Q1 and Q2. A temperature sensor 54 is provided in, for example, the housing 42 and detects a temperature Tw of the cooling liquid flowing in the coolant channel 44. The temperatures Tt and Tw detected by the temperature sensors 52 and 54 are input to the electronic control unit 40.

The electronic control unit 40 controls the switching operation of the power transistors Q1 and Q2 of the DC-DC converter 32, to control a voltage conversion ratio (voltage boosting ratio) of the DC-DC converter 32. In addition, the electronic control unit 40 controls the switching operation of the power transistors Q11~Q16 of the inverter 34, to control driving of the motor generator 38, and controls the power transistors Q21~Q26 of the inverter 36, to control driving of the motor generator 39. Next, details of a process of the electronic control unit 40 controlling the voltage conversion ratio of the DC-DC converter 32 will be described.

Figure 3:
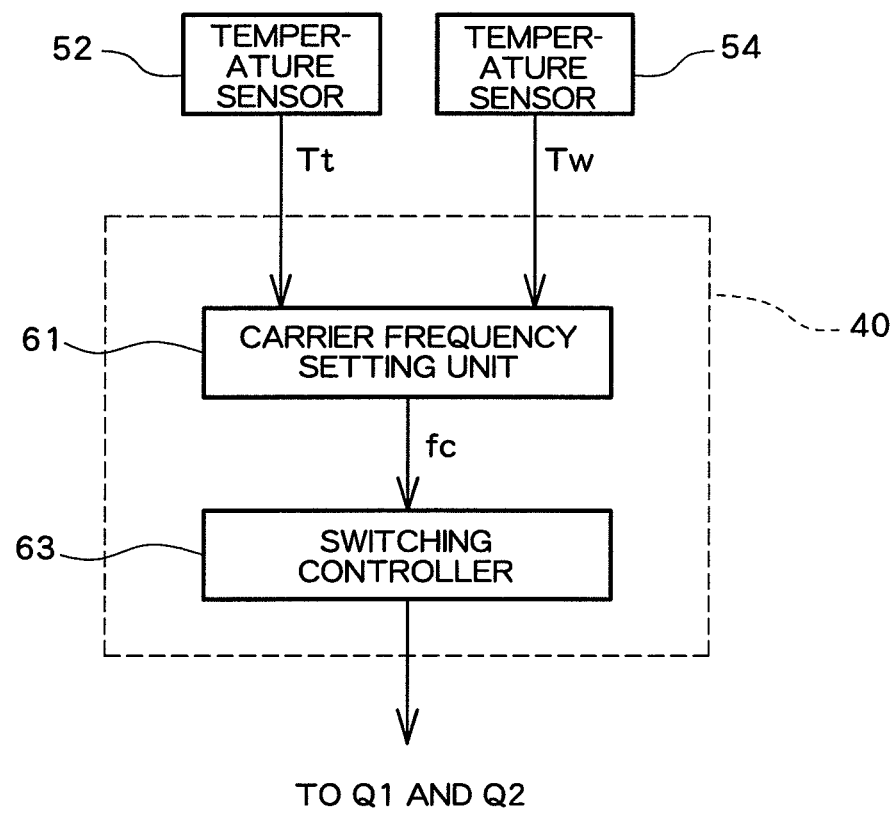
FIG. 3 is a block diagram showing an example configuration of an electronic control unit.
Figure 4:
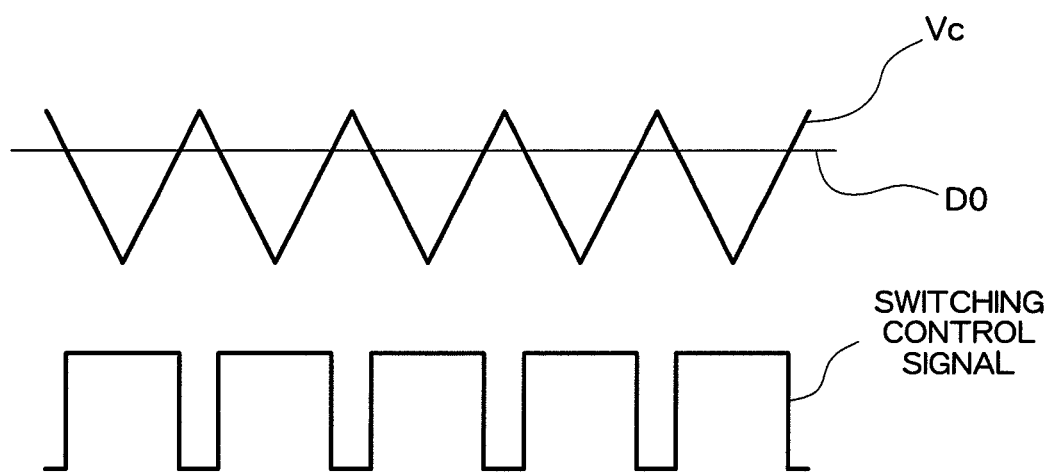
FIG. 4 is a diagram for explaining an example method of generating a switching control signal to the DC-DC converter.

The electronic control unit 40 may comprise, for example, a carrier frequency setting unit 61 and a switching controller 63, as shown in a functional block diagram of FIG. 3. The carrier frequency setting unit 61 sets a frequency fc of a reference carrier based on the temperature Tt of the power transistors Q1 and Q2 detected by the temperature sensor 52 and the temperature Tw of the cooling liquid detected by the temperature sensor 54, to set a switching frequency fc of the power transistors Q1 and Q2. The switching controller 63 controls, with the frequency fc of the reference carrier (switching frequency) which is set by the carrier frequency setting unit 61, a duty ratio D of a switching control signal which controls ON and OFF of the power transistors Q1 and Q2, to control a voltage conversion ratio (voltage boosting ratio) of the DC-DC converter 32. Here, for example, as shown in FIG. 4, a switching control signal having the duty ratio D=target duty ratio D0 can be generated based on a comparison result of a duty ratio command (target duty ratio) D0 and a reference carrier (triangular wave carrier) Vc. In the example configuration of the DC-Dc converter 32 of FIG. 1, the duty ratio D which is a ratio between a conductive period of the power transistor Q1 at the upper side (Q1on) and a conductive period of the power transistor Q2 at the lower side (Q2 on) is represented by D=Q1on/(Q1on+Q2on), and the voltage conversion ratio (voltage boosting ratio) of the DC-DC converter 32 is increased in response to a decrease in the duty ratio D (=Q1on/(Q1on+Q2on)).

Figure 5:
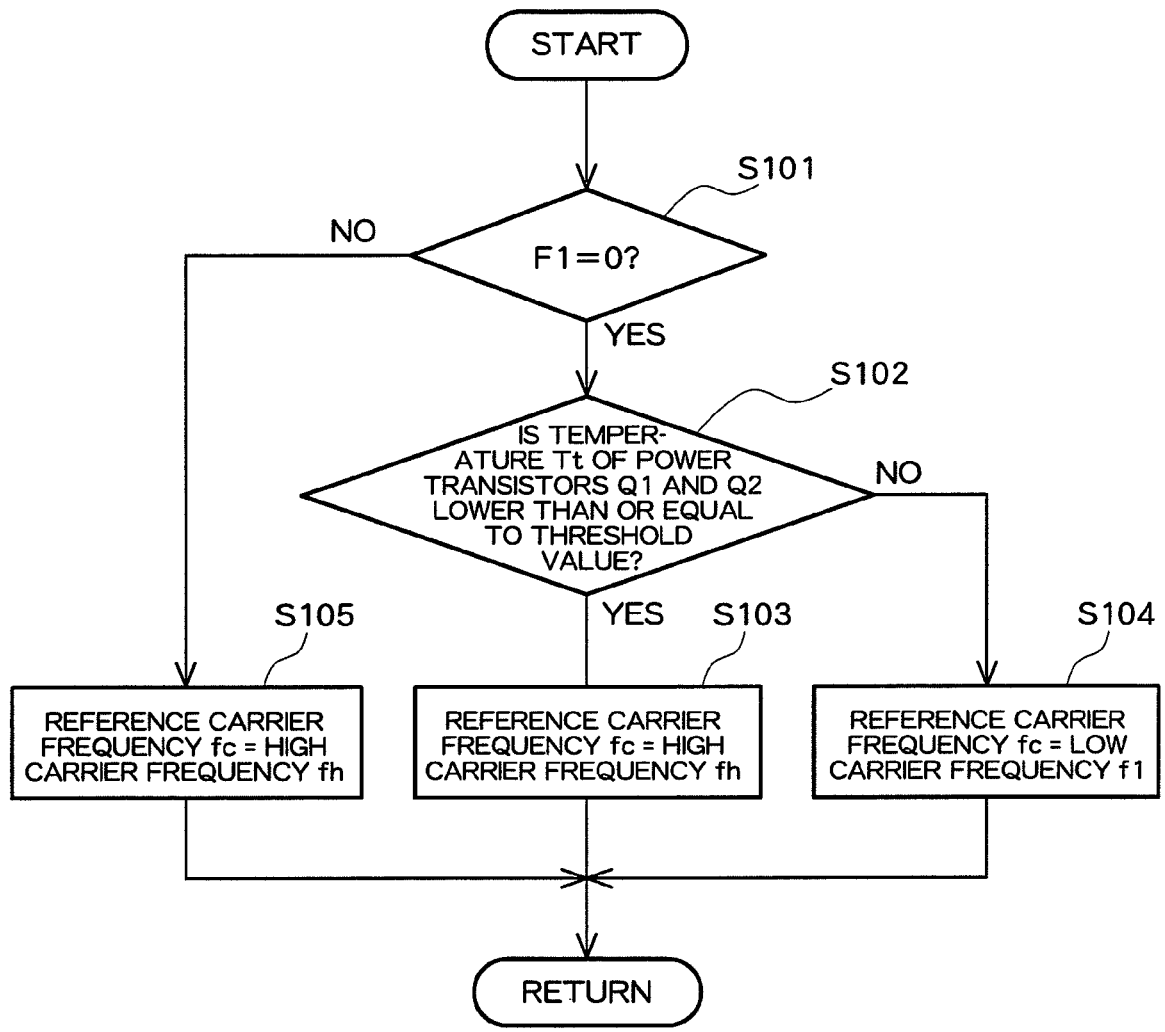
FIG. 5 is a flowchart for explaining a process executed by an electronic control unit.
Figure 6:
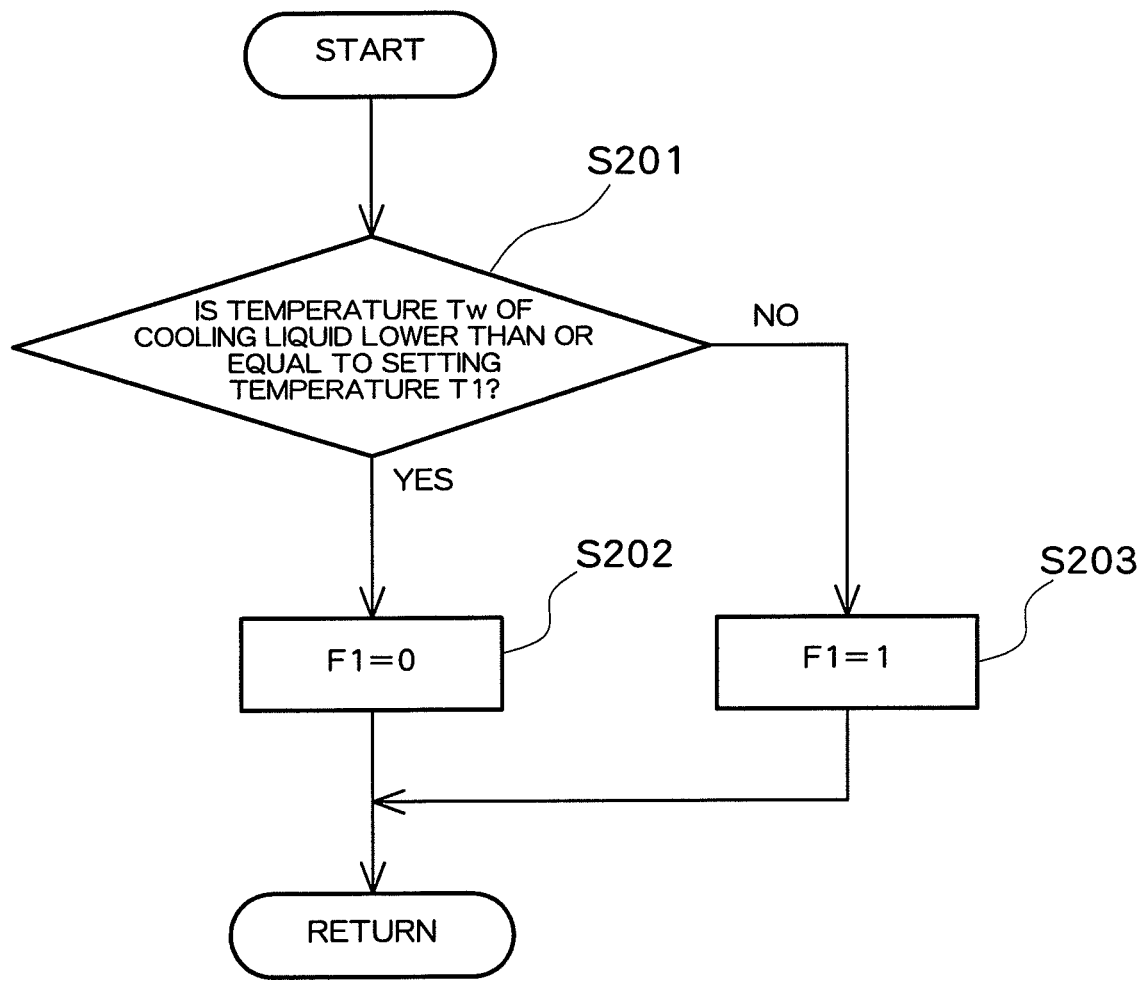
FIG. 6 is a flowchart for explaining a process executed by an electronic control unit.
Figure 7:
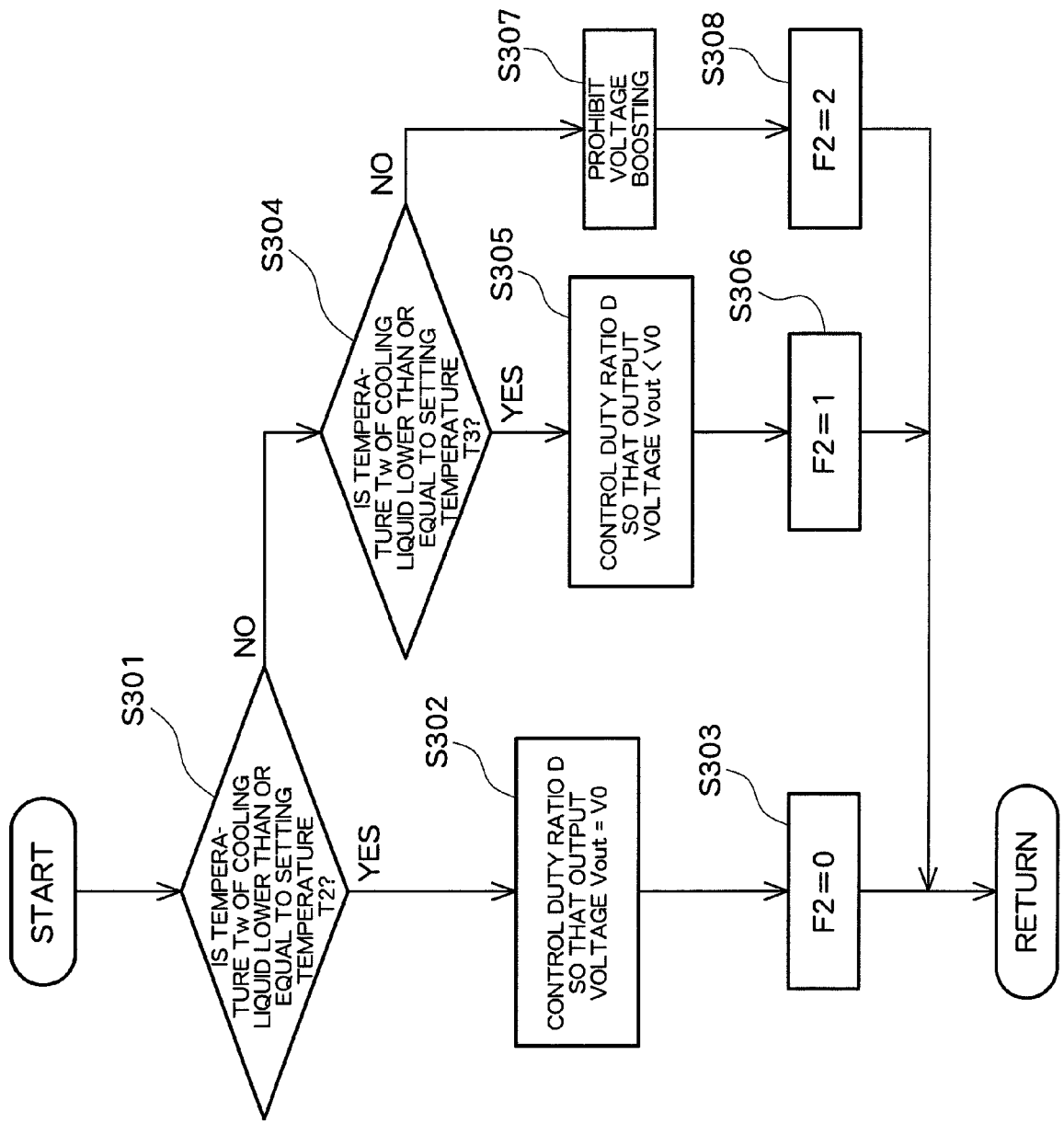
FIG. 7 is a flowchart for explaining a process executed by an electronic control unit.

FIGS. 5 and 6 are flowcharts for explaining a process of the carrier frequency setting unit 61 setting the frequency fc of the reference carrier (switching frequency of the power transistors Q1 and Q2) and FIG. 7 is a flowchart for explaining a process of the switching controller 63 of the electronic control unit 40 controlling the output voltage of the DC-DC converter 32. The processes in the flowcharts of FIGS. 5-7 are repetitively executed at a predetermined period when the ignition of the vehicle is switched ON.

In step s101 of the flowchart of FIG. 5, it is judged whether or not a value of a flag F1 is 0. When the value of the flag F1 is 0 (when the judgment result of step s101 is YES), the process proceeds to step s102 and, when the value of the flag F1 is not 0 (when the judgment result of step s101 is NO), the process proceeds to step s105. The flag F1 is set to an initial value of 0 when the ignition is switched ON.

In step s102, it is judged whether or not the temperature Tt of the power transistors Q1 and Q2 detected by the temperature sensor 52 is less than or equal to a threshold value. When the temperature Tt of the power transistors Q1 and Q2 is lower than or equal to the threshold value (when the judgment result of step S102 is YES), the process proceeds to step s103, and the frequency fc of the reference carrier is set to a high carrier frequency fh. When, on the other hand, the temperature Tt of the power transistors Q1 and Q2 is higher than the threshold value (when the judgment result of step s102 is NO), the process proceeds to step s104, and the frequency fc of the reference carrier is set at a low carrier frequency fl which is lower than the high carrier frequency fh (fl<fh). In step s105, the frequency fc of the reference carrier is fixed to the high carrier frequency fh and the use of the low carrier frequency fl is prohibited.

Figure 8:
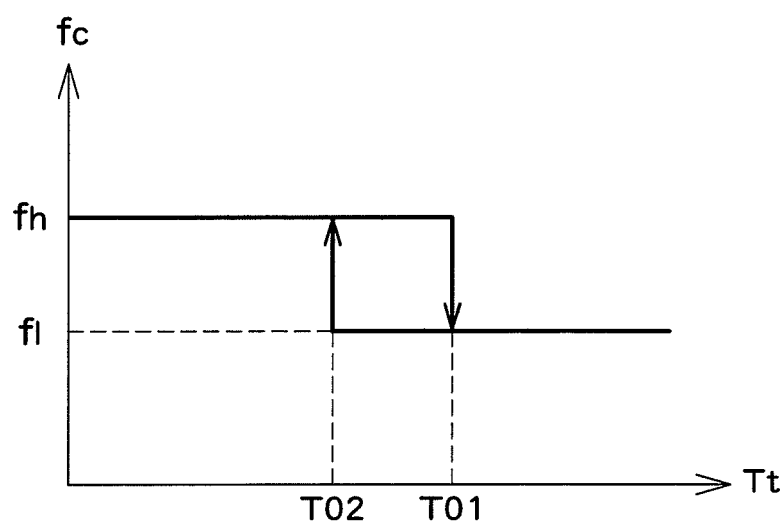
FIG. 8 is a diagram for explaining an operation of a voltage conversion unit according to a preferred embodiment of the present invention.

The threshold value used in the judgment in step s102 may be set to different values between the case where the frequency fc of the reference carrier is the low carrier frequency fl and the case where the frequency fc of the reference carrier is the high carrier frequency fh. For example, a configuration may be employed in which, in step s102, when the frequency fc of the reference carrier is the high carrier frequency fh, it is judged whether or not the temperature Tt of the power transistors Q1 and Q2 is less than or equal to a threshold value T01, and when the frequency fc of the reference carrier is the low carrier frequency fl, it is judged whether or not the temperature Tt of the power transistors Q1 and Q2 is less than or equal to a threshold value T02 (wherein T02<T01). In this example configuration, as shown in FIG. 8, if the frequency fc of the reference carrier is the high carrier frequency fh, when the temperature Tt of the power transistors Q1 and Q2 becomes higher than the threshold value T01, the frequency fc of the reference carrier is reduced from the high carrier frequency fh to the low carrier frequency fl. If, on the other hand, the frequency fc of the reference carrier is the low carrier frequency fl, when the temperature Tt of the power transistors Q1 and Q2 becomes lower than or equal to the threshold value T02, the frequency fc of the reference carrier is increased from the low carrier frequency fl to the high carrier frequency fh. As shown in FIG. 8, by providing hysteresis in the relationship between the temperature Tt of the power transistors Q1 and Q2 and the frequency fc of the reference carrier, it is possible to suppress occurrence of hunting due to a change of the frequency fc of the reference carrier in a short period.

In step s201 of the flowchart of FIG. 6, it is judged whether or not the temperature Tw of the cooling liquid detected by the temperature sensor 54 is lower than or equal to the setting temperature T1. When the temperature Tw of the cooling liquid is lower than or equal to the set temperature T1 (when the judgment result of step s201 is YES), the process proceeds to step s202, and the value of the flag F1 is set to 0. When, on the other hand, the temperature Tw of the cooling liquid is higher than the set temperature T1 (when the judgment result in step s201 is NO), the process proceeds to step s203, and the value of the flag F1 is set to 1. The value of the flag F1 in this process represents whether or not the use of the low carrier frequency fl is prohibited, with "F1=0" indicating a state where the use of the low carrier frequency fl is allowed and "F1=1" indicating a state where the use of the low carrier frequency fl is prohibited. In addition, it is also possible to set the set temperature T1 used in the judgment of step S201 to a lower value when the value of the flag F1 is 1 than that when the value of the flag F1 is 0, so that hysteresis is provided in the relationship between the temperature Tw of the cooling liquid and the value of the flag F1. According to the process of the flowcharts of FIGS. 5 and 6, while the frequency fc of the reference carrier is set to a low value of the low carrier frequency fl when the temperature Tt of the power transistors Q1 and Q2 exceeds a threshold value, the frequency fc of the reference carrier is set to a high value of the high carrier frequency fh when the temperature Tw of the cooling liquid exceeds the set temperature T1. In other words, the carrier frequency setting characteristic determined based on the temperature Tt of the power transistors Q1 and Q2 and the carrier frequency setting characteristic determined based on the temperature Tw of the cooling liquid differ from each other.

During the switching operation of the power transistors Q1 and Q2, heat is generated in the power transistors Q1 and Q2, and the amount of generated heat in the power transistors Q1 and Q2 increases as the switching frequency (frequency of reference carrier) fc is increased. According to the process of the flowchart of FIG. 5, when the temperature Tt of the power transistors Q1 and Q2 exceeds the threshold value, the frequency fc of the reference carrier is changed from the high carrier frequency fh to a lower value of the low carrier frequency fl, so that the temperature increase of the power transistors Q1 and Q2 can be suppressed and the overheating of the power transistors Q1 and Q2 can be prevented. When the frequency of the reference carrier (switching frequency of the power transistors Q1 and Q2) fc is reduced, however, although the amount of generated heat of the power transistors Q1 and Q2 is reduced, the ripple component of the current flowing through the reactor L and the filtering capacitor C1 is increased, and the amount of generated heat in the reactor L and the filtering capacitor C1 is increased. In other words, in the DC-DC converter 32, the temperature increase characteristic of the power transistors Q1 and Q2 and the temperature increase characteristic of the reactor L and the filtering capacitor C1 are opposite characteristics with respect to the frequency change of the reference carrier. Because of this, when the frequency (number of times) that the frequency fc of the reference carrier is set to the low carrier frequency f1 is increased, although the temperature increase of the power transistors Q1 and Q2 is suppressed, the amount of temperature increase due to the ripple current of the reactor L and the filtering capacitor C1 is increased, resulting in a higher tendency to overheat.

Figure 9:
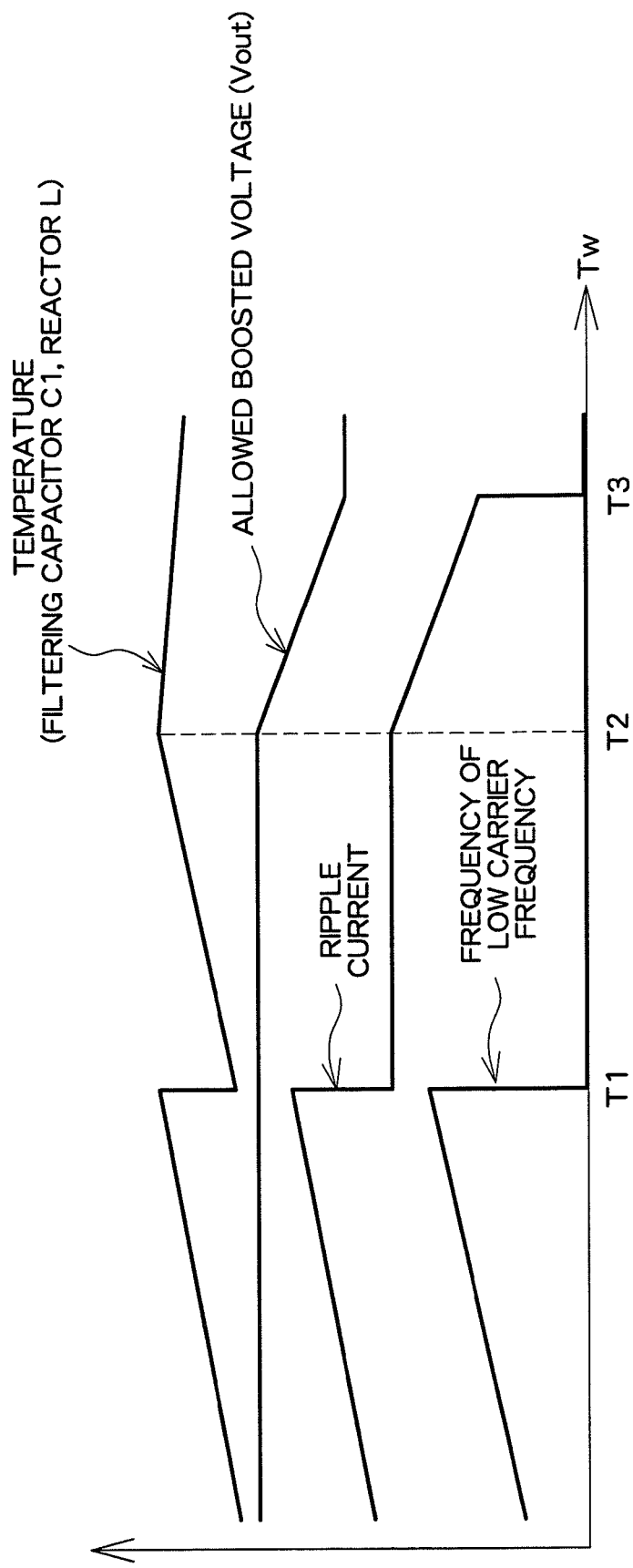
FIG. 9 is a diagram for explaining an operation of a voltage conversion unit according to a preferred embodiment of the present invention.

In the process of the flowchart of FIGS. 5 and 6, on the other hand, when the temperature Tw of the cooling liquid exceeds the set temperature T1, the frequency fc of the reference carrier is set to the high carrier frequency fh regardless of the temperature Tt of the power transistors Q1 and Q2, and the use of the low carrier frequency f1 is prohibited. Here, the temperature Tt of the power transistors Q1 and Q2 changes according to the temperature Tw of the cooling liquid and the current flowing through the power transistors Q1 and Q2, and tends to be increased as the temperature Tw of the cooling liquid is increased and also as the current flowing through the power transistors Q1 and Q2 is increased. Because of this, when the temperature Tw of the cooling liquid is high, it is possible to judge that the temperature Tt of the power transistors Q1 and Q2 is high, and the frequency (number of times) that the frequency fc of the reference carrier is set to the low carrier frequency f1 is high, and consequently it is possible to judge that the temperature of the reactor L and the filtering capacitor C1 is also high because of the increase in the ripple current flowing through the reactor L and the filtering capacitor C1. Therefore, in the present embodiment, when the temperature of the reactor L and the filtering capacitor C1 is high, the frequency fc of the reference carrier is fixed to the high carrier frequency fh (by prohibiting the use of the low carrier frequency f1), so that the ripple current flowing through the reactor L and the filtering capacitor C1 is reduced as shown in FIG. 9, to thereby suppress the temperature increase in the reactor L and the filtering capacitor C1. As a result, the overheating of the reactor L and the filtering capacitor C1 can be prevented. In addition, in the present embodiment, the temperature increase of the reactor L and the filtering capacitor C1 can be suppressed without directly detecting the temperature of the reactor L and the filtering capacitor C1. As a result, the temperature sensor for detecting the temperature of the reactor L and the filtering capacitor C1 can be omitted, so that the device structure can be simplified and the cost can be reduced.

In step S301 of the flowchart of FIG. 7, it is judged whether or not the temperature Tw of the cooling liquid detected by the temperature sensor 54 is lower than or equal to a sett temperature T2 (wherein T2>T1). When the temperature Tw of the cooling liquid is lower than or equal to the set temperature T2 (when the judgment result of step s301 is YES), the process proceeds to step S302, and the duty ratio D of the switching control signal to the power transistors Q1 and Q2 is controlled and the voltage boosting ratio of the DC-DC converter 32 is controlled so that the output voltage (voltage of the averaging capacitor C2) Vout of the DC-DC converter 32 is set to a predetermined target output voltage V0 (wherein V0>Vb, Vb being the voltage of the secondary battery 31). Then, in step s303, a value of a flag F2 is set to 0. When, on the other hand, the temperature Tw of the cooling liquid is higher than the set temperature T2 (when the judgment result in step s301 is NO), the process proceeds to step s304. When the ignition is switched ON, the flag F2 is set to an initial value of 0.

In step s304, it is judged whether or not the temperature Tw of the cooling liquid is lower than or equal to the set temperature T3 (wherein T3>T2). When the temperature Tw of the cooling liquid is lower than or equal to the set temperature T3 (when the judgment result in step s304 is YES), the process proceeds to step s305, and the duty ratio D of the switching control signal (voltage boosting ratio of the DC-DC converter 32) is controlled so that the output voltage Vout of the DC-DC converter 32 is reduced compared to the target output voltage V0 when the temperature Tw of the cooling liquid is lower than or equal to the set temperature T2. Here, the output voltage Vout of the DC-DC converter 32 (voltage boosting ratio) can be gradually reduced with respect to the increase of the temperature Tw of the cooling liquid from the set temperature T2 or the output voltage Vout of the DC-DC converter 32 (voltage boosting ratio) can be stepwise reduced with respect to the increase of the temperature Tw of the cooling liquid from the set temperature T2. Then, in step s306, the value of the flag F2 is set to 1. When the temperature Tw of the cooling liquid is higher than the set temperature T3 (when the judgment result of step s304 is NO), the process proceeds to step s307.

In step s307, the switching operation of the power transistors Q1 and Q2 is prohibited so that the voltage boosting (voltage conversion) at the DC-DC converter 32 is prohibited. Here, because the power transistor Q1 is maintained in the ON state and the power transistor Q2 is maintained in the OFF state, the output voltage Vout of the DC-DC converter 32 becomes equal to the input voltage Vb of the DC-DC converter 32 (voltage of the secondary battery 31). Then, in step s308, the value of the flag F2 is set to 2. The value of the flag F2 in this process represents whether or not the voltage boosting by the DC-DC converter 32 is limited or prohibited, and "F2=0" indicates that the voltage boosting by the DC-DC converter 32 is neither limited nor prohibited, "F2=1" indicates that the voltage boosting by the DC-DC converter 32 is limited, and "F2=2" indicates that the voltage boosting by the DC-DC converter 32 is prohibited. In addition, the setting temperatures T2 and T3 used in the judgments of steps s301 and S304 may be set to be lower in the case where the value of the flag F2 is 1 than in the case where the value of the flag F2 is 0 and to be lower in the case where the value of the flag F2 is 2 than in the case where the value of the flag F2 is 1, so that hysteresis is provided in the relationship between the temperature Tw of the cooling liquid and the value of the flag F2.

According to the process of the flowchart of FIG. 7, when the temperature Tw of the cooling liquid exceeds the set temperature T2 (wherein T2>T1), the duty ratio D of the switching control signal is limited so that the voltage boosting ratio (voltage conversion ratio) of the DC-DC converter 32 is reduced compared to the case where the temperature Tw of the cooling liquid is lower than or equal to the set temperature T2. With this configuration, even when the temperature of the reactor L and the filtering capacitor C1 is increased after the frequency fc of the reference carrier is fixed to the high carrier frequency fh, it is possible to further reduce the ripple current flowing in the reactor L and the filtering capacitor C1, as shown in FIG. 9. Therefore, it is possible to suppress the temperature increase in the reactor L and the filtering capacitor C1 without directly detecting the temperature of the reactor L and the filtering capacitor C1.

Moreover, according to the process of the flowchart of FIG. 7, when the temperature Tw of the cooling liquid exceeds the set temperature T3 (wherein T3>T2), the voltage boosting by the DC-DC converter 32 is prohibited, and the power transistor Q1 is maintained in the ON state and the power transistor Q2 is maintained in the OFF state so that the output voltage Vout of the DC-DC converter 32 becomes equal to the input voltage Vb. With this configuration, even if the temperature of the reactor L and the filtering capacitor C1 is increased after the duty ratio D of the switching control signal is limited so that the output voltage Vout of the DC-DC converter 32 is reduced to a value lower than V0, the ripple current flowing in the reactor L and the filtering capacitor C1 can be eliminated, as shown in FIG. 9. Therefore, it is possible to suppress the temperature increase of the reactor L and the filtering capacitor C1 without directly detecting the temperature of the reactor L and the filtering capacitor C1.

In the above description of the preferred embodiment, a configuration is described in which the process to fix the frequency fc of the reference carrier to the high carrier frequency fh is executed when the temperature Tw of the cooling liquid is higher than the set temperature T1, the process to limit the duty ratio D (voltage boosting ratio) is executed to reduce the output voltage Vout of the DC-DC converter 32 to a value lower than V0 when the temperature Tw of the cooling liquid is higher than the set temperature T2 (wherein T2>T1), and the process to prohibit the switching operation (voltage boosting by the DC-DC converter 32) of the power transistors Q1 and Q2 is executed when the temperature Tw of the cooling liquid is higher than the set temperature T3 (wherein T3>T2). In the present embodiment, however, the temperature increase of the reactor L and the filtering capacitor C1 can be suppressed by executing only one or more of these processes. For example, it is also possible to employ a configuration in which the process to fix the frequency fc of the reference carrier to the high carrier frequency fh is executed when the temperature Tw of the cooling liquid is higher than the set temperature T1, and the process to limit the duty ratio D to reduce the output voltage Vout of the DC-DC converter 32 to a value lower than V0 is executed when the temperature Tw of the cooling liquid is higher than the sett temperature T2 (wherein T2>T1). Alternatively, it is also possible to employ a configuration in which the process to fix the frequency fc of the reference carrier to the high carrier frequency fh is executed when the temperature Tw of the cooling liquid is higher than the set temperature T1, and the process to prohibit the switching operation of the power transistors Q1 and Q2 is executed when the temperature Tw of the cooling liquid is higher than the setting temperature T3 (wherein T3>T1). Alternatively, it is also possible to employ a configuration in which the process to limit the duty ratio D to reduce the output voltage Vout of the DC-DC converter 32 to a value lower than V0 is executed when the temperature Tw of the cooling liquid is higher than the set temperature T2, and the process to prohibit the switching operation of the power transistors Q1 and Q2 is executed when the temperature Tw of the cooling liquid is higher than the set temperature T3 (wherein T3>T2). In addition, in the present embodiment, it is also possible to execute only the process to fix the frequency fc of the reference carrier to the high carrier frequency fh when the temperature Tw of the cooling liquid is higher than the set temperature T1. Alternatively, it is also possible to execute only the process to limit the duty ratio D to reduce the output voltage Vout of the DC-DC converter 32 to a value lower than V0 when the temperature Tw of the cooling liquid is higher than the set temperature T2. Alternatively, it is also possible to execute only the process to prohibit the switching operation of the power transistors Q1 and Q2 when the temperature Tw of the cooling liquid is higher than the set temperature T3.

Moreover, in the present embodiment, it is also possible to employ a configuration in which a temperature of the filtering capacitor C1 detected by a temperature sensor (not shown) is used in place of the temperature Tw of the cooling liquid in the process of the flowchart of FIGS. 6 and 7. Furthermore, the structure of the DC-DC converter 32 to which the present invention can be applied is not limited to the structure of FIG. 1, and the present invention can be applied to DC-DC converters of structures other than that shown in FIG. 1.

A preferred embodiment of the present invention has been described. The present invention, however, is not limited to the specific embodiment described herein, and various modifications may be made within the scope of the present invention.

The invention claimed is:

1. A voltage conversion device having a DC-DC converter which comprises a reactor which can temporarily accumulate energy using a direct current from a direct current power supply, and a switching element, and which converts, using the energy accumulated in the reactor, direct current power from the direct current power supply to a direct current power of a different voltage value utilizing a switching operation of the switching element and outputs the converted power, a capacitor which is provided at an input side of the DC-DC converter and in parallel with the direct current power supply, and a cooling unit which cools the capacitor with a cooling medium, the voltage conversion device comprising:
   a cooling medium temperature detecting unit which detects a temperature of the cooling medium for cooling the capacitor;
   a switching frequency setting unit which sets a switching frequency of the switching element based on both the temperature of the cooling medium for cooling the capacitor and a temperature of the switching element; and
   a switching controller which controls the switching operation of the switching element by the set switching frequency, to control a voltage conversion ratio of the DC-DC converter,
   wherein:
      the switching frequency setting unit sets the switching frequency of the switching element to a first frequency or a second frequency which is lower than the first frequency, based on the temperature of the switching element, and
      when the temperature of the cooling medium for cooling the capacitor detected by the cooling medium temperature detecting unit is higher than a set temperature T1, the switching frequency setting unit sets the switching frequency of the switching element to the first frequency regardless of the temperature of the switching element.

2. The voltage conversion device according to claim 1, wherein
   when the temperature of the cooling medium for cooling the capacitor detected by the cooling medium temperature detecting unit is higher than a setting temperature T3 (wherein T3>T1), the switching controller prohibits the switching operation of the switching element.

3. The voltage conversion device according to claim 1, wherein
   when the temperature of the cooling medium for cooling the capacitor detected by the cooling medium temperature detecting unit is higher than a set temperature T2 (wherein T2>T1), the switching controller controls the switching operation of the switching element to reduce the voltage conversion ratio of the DC-DC converter compared to that when the temperature of the cooling medium for cooling the capacitor is lower than or equal to the set temperature T2.

4. The voltage conversion device according to claim 3, wherein
when the temperature of the cooling medium for cooling the capacitor detected by the cooling medium temperature detecting unit is higher than a set temperature T3 (wherein T3>T2), the switching controller prohibits the switching operation of the switching element.

5. The voltage conversion device according to claim 1, wherein
a switching frequency setting characteristic determined based on the temperature of the switching element and a switching frequency setting characteristic determined based on the temperature of the cooling medium for cooling the capacitor are different characteristics.

6. A voltage conversion device having a DC-DC converter which comprises a reactor which can temporarily accumulate energy using direct current from a direct current power supply, and a switching element and which converts, using the energy accumulated in the reactor, direct current power from the direct current power supply to direct current power of a different voltage value utilizing a switching operation of the switching element and outputs the converted power, a capacitor which is provided at an input side of the DC-DC converter and in parallel with the direct current power supply, and a cooling unit which cools at least one of the reactor and the capacitor with a cooling medium, the voltage conversion device comprising:
a switching frequency setting unit which sets a switching frequency of the switching element to a first frequency or a second frequency which is lower than the first frequency, based on a temperature of the switching element;
a switching controller which controls the switching operation of the switching element by the set switching frequency, to control a voltage conversion ratio of the DC-DC converter; and
a cooling medium temperature detecting unit which detects a temperature of the cooling medium for cooling at least one of the reactor and the capacitor, wherein
when the temperature of the cooling medium for cooling at least one of the reactor and the capacitor detected by the cooling medium temperature detecting unit is higher than a set temperature T2, the switching controller controls the switching operation of the switching element to reduce the voltage conversion ratio of the DC-DC converter compared to that when the temperature of the cooling medium for cooling at least one of the reactor and the capacitor is lower than or equal to the set temperature T2.

7. The voltage conversion device according to claim 6, wherein
when the temperature of the cooling medium for cooling at least one of the reactor and the capacitor detected by the cooling medium temperature detecting unit is higher than a set temperature T3 (wherein T3>T2), the switching controller prohibits the switching operation of the switching element.

8. A voltage conversion device having a DC-DC converter which comprises a reactor which can temporarily accumulate energy using direct current from a direct current power supply, and a switching element and which converts, using the energy accumulated in the reactor, direct current power from the direct current power supply to direct current power of a different voltage value utilizing a switching operation of the switching element and outputs the converted power, a capacitor which is provided at an input side of the DC-DC converter and in parallel with the direct current power supply, and a cooling unit which cools at least one of the reactor and the capacitor with a cooling medium, the voltage conversion device comprising:
a switching frequency setting unit which sets a switching frequency of the switching element to a first frequency or a second frequency which is lower than the first frequency, based on a temperature of the switching element;
a switching controller which controls the switching operation of the switching element by the set switching frequency, to control a voltage conversion ratio of the DC-DC converter; and
a cooling medium temperature detecting unit which detects a temperature of the cooling medium for cooling at least one of the reactor and the capacitor, wherein
when the temperature of the cooling medium for cooling at least one of the reactor and the capacitor detected by the cooling medium temperature detecting unit is higher than a set temperature T3, the switching controller prohibits the switching operation of the switching element.

9. A voltage conversion device having a DC-DC converter which comprises a reactor which can temporarily accumulate energy using a direct current from a direct current power supply, and a switching element, and which converts, using the energy accumulated in the reactor, direct current power from the direct current power supply to a direct current power of a different voltage value utilizing a switching operation of the switching element and outputs the converted power, a capacitor which is provided at an input side of the DC-DC converter and in parallel with the direct current power supply, and a cooling unit which cools the capacitor with a cooling medium, the voltage conversion device comprising:
a cooling medium temperature detecting unit which detects a temperature of the cooling medium for cooling the capacitor;
a switching frequency setting unit which sets a switching frequency of the switching element based on both the temperature of the cooling medium for cooling the capacitor and a temperature of the switching element; and
a switching controller which controls the switching operation of the switching element by the set switching frequency, to control a voltage conversion ratio of the DC-DC converter,
wherein a switching frequency setting characteristic determined based on the temperature of the switching element and a switching frequency setting characteristic determined based on the temperature of the cooling medium for cooling the capacitor are different characteristics.

* * * * *